United States Patent

[11] 3,584,948

[72] Inventor Donald R. Herriott
Morris Township, N.J.
[21] Appl. No. 739,327
[22] Filed June 24, 1968
[45] Patented June 15, 1971
[73] Assignee Bell Telephone Laboratories, Incorporated
Murray Hill, N.J.

[54] APPARATUS AND METHOD FOR PRODUCING MULTIPLE IMAGES
5 Claims, 3 Drawing Figs.

[52] U.S. Cl. ........ 355/77, 355/46, 355/54
[51] Int. Cl. ........ G03b 27/32
[50] Field of Search ........ 355/46, 54, 77

[56] References Cited

UNITED STATES PATENTS 3,399,593 9/1968 Delp ........ 355/2 X
3,408,143 10/1968 Mueller ........ 355/40
3,478,661 11/1969 Heckscher ........ 352/45 X

*Primary Examiner*—John M. Horan
*Attorneys*—R. J. Guenther and Arthur J. Torsiglieri

ABSTRACT: Multiple images of a photolithography mask are produced, for simultaneously exposing a plurality of regions of a photoresist coating on a semiconductor substrate, by directing monochromatic light through the mask, collimating the light, and transmitting it through a first diffraction grating with vertical rulings and a second diffraction grating with horizontal rulings. The diffraction gratings each divide the light into a plurality of diffraction orders each containing the image to be recorded; and each of these images is imaged on the photoresist coating.

INVENTOR
D.R. HERRIOTT
BY
Roderick B Anderson
ATTORNEY

APPARATUS AND METHOD FOR PRODUCING MULTIPLE IMAGES

BACKGROUND OF THE INVENTION

In the fabrication of semiconductor devices such as integrated circuits, photolithographic techniques are used for establishing areas on a semiconductor wafer to which subsequent processing steps are to be restricted. A semiconductor wafer is typically coated with a photosensitive film, usually referred to as photoresist, and exposed to light projected through a photolithography mask containing an intricate pattern. Development of the selectively exposed photoresist, followed by appropriate etching, leaves a photographically printed pattern on the photoresist that is itself used as a mask to permit selective processes such as coating or impurity diffusion. Modern semiconductor fabrication often requires several such printing steps to be performed successively, with each exposure to the photolithography mask being in precisely controlled registration with previously formed configurations on the wafer.

Moreover, it is not unusual to make numerous exposures of the photoresist coating to a single mask in order that numerous identical devices may be made from the wafer. This is typically done by a step-and-repeat operation in which the substrate is moved with respect to the mask after each exposure so that different regions of the coating may be successively exposed. Mechanisms are of course required for moving the substrate with extremely high accuracy in order to maintain the required registration of successive mask exposures of each wafer region. Multiple lens systems, known as "fly's eye lenses," which project multiple images of a single mask onto a photoresist coating have alternatively been used; but it is difficult to make these lenses with the accuracy and regularity of spacing of the images required in systems using successive exposures of each region.

SUMMARY OF THE INVENTION

I have found that multiple images of a photolithography mask may be formed and used to expose simultaneously a plurality of regions of a photoresist coating on a semiconductor substrate by directing monochromatic light through the mask, collimating the light, and transmitting it through a first diffraction grating with vertical rulings and a second diffraction grating with horizontal rulings. The first diffraction grating divides the light into a plurality of diffraction orders, each containing an image of the mask, and the second diffraction grating divides each of the diffraction orders into a plurality of second diffraction orders, each of which also contains the image. The images contained in the second set of diffraction orders are then imaged onto the photoresist coating and a large plurality of identical exposures of the coating to the mask image are made.

As will be explained hereinafter, the diffraction gratings should be designed such that the various diffraction orders they project do not overlap and separate mask images are projected onto the photoresist. It is also preferred that the gratings be designed such that the light projected along the various diffraction orders to be used are of substantially equal intensity.

By this technique, the pattern of a single mask simultaneously exposes a large number of regions on the surface of a semiconductor wafer, thereby permitting a number of identical devices to be fabricated from the wafter without resort to the step-and-repeat operation described above. The fabrication of the diffraction gratings is not as exacting as that of fly's-eye lenses because defects or errors in the spacing or formation of individual rulings of the grating would not ordinarily affect the position at which individual images are projected; rather, such defects would merely increase the proportion of scattered light or "background noise."

These and other objects, features and advantages of the invention will be better understood from a consideration of the following detailed description, taken in conjunction with the accompanying drawing.

DRAWING DESCRIPTION

FIG. 1 is a schematic illustration of optical apparatus in accordance with an illustrative embodiment of the invention; and FIGS. 2 and 3 are side views of diffraction gratings used in the apparatus of FIG. 1.

DETAILED DESCRIPTION

Figure 1:
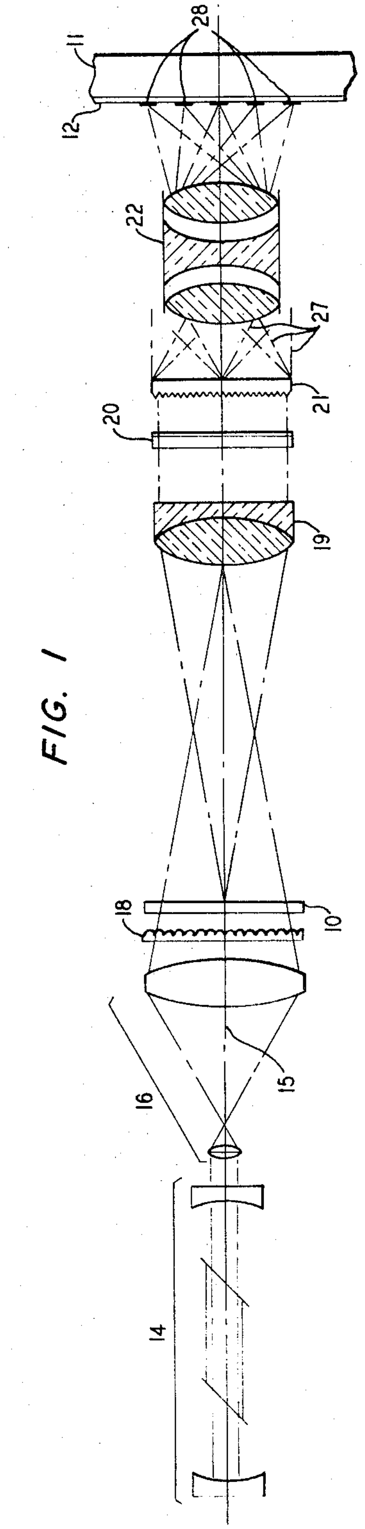

Referring now to FIG. 1, there is shown optical apparatus for projecting multiple images of a photolithography mask 10 onto a semiconductor wafer 11, one surface of which is coated with photoresist material 12. A laser 14 forms and projects a beam of substantially monochromatic light along an optical axis 15. Matching telescope lenses 16 expand the beam so that it is projected through a pattern (not shown) on the photolithography mask 10. A diffusion screen 18 is included adjacent the mask in order to provide substantially uniform light intensity illumination of the mask.

Figure 3:
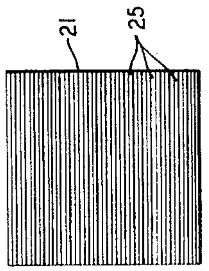
Figure 2:
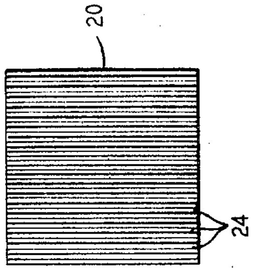

Light projected through the mask is transmitted through a collimating lens 19, a first diffraction grating 20, a second diffraction grating 21, a wide angle lens 22 and hence to wafer 11. As shown in FIGS. 2 and 3, the first diffraction grating 20 comprises an array of vertically extending rulings 24 while the second diffraction grating 21 comprises horizontally extending rulings 25. As is known in the art, the diffraction gratings preferably comprise transparent medium such as glass upon which the rulings have been formed by cutting parallel grooves on one surface with a scribing instrument.

The vertically extending rulings of the first diffraction grating 20 diffract the light transmitted through it into a plurality of horizontally displaced diffraction orders. Each of these diffraction orders of course contains the image of the mask 10, and, when it is projected through the second grating 21, is in turn diffracted into a plurality of vertically displaced diffraction orders. Hence, the light leaving diffraction grating 21 is in the form of a number of diffraction orders which is equal to the product of the number of diffractions orders produced by the two gratings. For example, if each grating forms seven usable diffraction orders, 49 diffraction orders, each containing an image of the mask, are projected from grating 21. These diffraction orders are in turn imaged by the wide angle lens 22 onto the photoresist coating 12 and a plurality of images of the mask 10 are simultaneously printed on the photoresist coating. Light rays 27 are included to indicate vertically displaced diffraction orders, while regions 28 on the photoresist coating schematically indicate the projected images.

The purpose of the collimating lens 19 is to project all of the light rays from the mask 10 along substantially parallel paths for substantially uniform diffraction by the first grating 20. If the angle subtended by the image of the mask 10 which is included in each of the diffraction orders is smaller than the angle of separation of the various diffraction orders, the images may be imaged on the wafer surface without overlap. As is known, the angles $\theta$ at which diffraction orders are projected from a diffraction grating are given by the equation $$\theta = \sin^{-1} n\lambda/s \qquad (1)$$

where $\theta$ is the angle of the diffracted beam relative to the normal incident beam, $s$ is the spacing of the rulings of the grating, $\lambda$ is the wavelength of the light, and $n$ is an integral number. Hence, by adjusting the grating spacing $s$ with respect to the wavelength $\lambda$, one may produce a multiplicity of diffraction orders, each spaced by an angle that is larger than the angle subtended by the mask image to be projected on the wafer. Each of these diffraction orders are in turn diffracted by the second grating 21 which also has a proper spacing between rulings with respect to the light wavelength to give a plurality of diffraction orders without overlap.

The collimating lens 19 collimates light from each point of the mask 10 and as such, has a field corrected for the single mask pattern. A relatively simple telescope objective of a 10 to 20 inch focal length may typically be used. The lens 22 is a wide angle high aperture objective that gives the final resolution required over the entire area of the mask. A 1 to 2 inch focal length *f*/2 lens to cover a 1½-inch diameter field at the single laser wavelength may be used, although various other lens designs could alternatively be used.

As is known, the distribution of energy from a grating is a Fourier transform of the complex amplitude of the transmitted light across the grating. By varying the groove shape of the rulings, a uniform intensity distribution may be obtained over many diffraction orders, and, if so desired, the outer diffraction orders, that is, those diffracted at the greatest angle from the central optical axis, may be made to have higher intensities than the other diffraction orders to compensate for increased transmission losses by the lens 22 at increasing distances from the axis 15.

The formation of multiple images simultaneously the photoresist coating 12 has obvious advantages over the currently used step-and-repeat system for producing multiple exposures of the coating to a single mask. The fabrication of the optical system described offers fewer problems than that of analogous fly's-eye lens systems because techniques for making precision diffraction gratings are well known, and also because defects that may occur in the gratings are typically manifested merely by an increase in the proportion of the scattered light or "-background noise" rather than by displacement of the location at which images are projected onto the wafer. Hence, diffraction grating defects do not normally complicate the problem of mask registration where successive exposures of each processed region of the wafer are to be made.

The embodiment that has been described is intended to be merely illustrative of the inventive concept involved. For example, a laser need not be used since other known light sources, particularly in conjunction with appropriate filters, can alternatively be used for producing substantially monochromatic light. It is believed that polychromatic light would be unsatisfactory because of differential diffraction by the gratings of the various component frequencies. The lens 16 and the diffusion screen are included merely to give uniform illumination of the mask and, while they are preferred when a laser that projects a narrow light beam is used, they may not be necessary in conjunction with other sources. It is believed that the absence of a collimating lens 19 or its equivalent would severely complicate the problem of producing undistorted and nonoverlapping multiple images by the diffraction grating mechanism. The absolute orientation of the diffraction gratings 20 and 21 is not of importance, but if the rulings 24 and 25 are not mutually orthogonal the problems of forming undistorted nonoverlapping images would again be complicated. Various other embodiments and modifications may be made by those skilled in the art without departing from the spirit and scope of the invention.

What I claim is:

1. Apparatus for simultaneously exposing a photoresist coating on a semiconductor substrate with a plurality of images of a pattern on a single photolithography mask comprising:

a photolithography mask containing a pattern;

means for directing substantially monochromatic light through the mask;

means for collimating the light;

means comprising a first diffraction grating for diffracting said collimated light into a plurality of first diffraction orders which are projected along separate paths, each of said first diffraction orders containing a mask pattern image;

means comprising a second diffraction grating for diffracting the light contained by the first diffraction orders into a second plurality of diffraction orders which are projected along separate paths, each of said second diffraction orders containing a mask pattern image; and means for imaging said mask pattern images contained on said second diffraction orders to a photoresist coating on a semiconductor substrate.

2. The apparatus of claim 1 wherein:

the first diffraction grating comprises a plurality of rulings extending in a first direction;

and the second diffraction grating comprises a plurality of rulings extending in a second direction which is substantially orthogonal to the first direction.

3. In a process for making semiconductor devices which includes the step of exposing a plurality of regions of a photoresist coating on a semiconductor substrate with the image of a mask containing a pattern, the improvement comprising:

projecting substantially monochromatic light through a mask;

collimating the light;

diffracting the light into a plurality of first diffraction orders each containing an image of the mask;

diffracting each of the first diffraction orders into a plurality of second diffraction orders each containing an image of the mask;

and imaging each of the second diffraction orders onto the photoresist coating of the semiconductor substrate.

4. The apparatus of claim 1 wherein:

each of the mask pattern images contained on each of the first diffraction orders subtends a first angle;

each of said first diffraction orders having a separation of at least a second angle;

said first angle being smaller than said second angle, whereby said multiple images do not overlap;

each of said mask pattern images contained on said second diffraction orders subtending a third angle;

each of said second diffraction orders having a separation of at least a fourth angle; and said third angle being smaller than said fourth angle, whereby said multiple mask pattern images do not overlap.

5. The apparatus of claim 1 wherein said first diffraction grating contains rulings that extend in a first direction;

said second grating containing rulings that extend in a second direction orthogonal to said first direction;

said rulings on said first and second gratings are substantially identical parallel grooves on a substantially transparent medium; and said grooves have a curvature such as to diffract light of substantially equal intensity along the paths of a plurality of diffraction orders.